United States Patent
Kamatani

(10) Patent No.: US 8,526,474 B2
(45) Date of Patent: Sep. 3, 2013

(54) MULTI-BEAM LASER POWER CONTROL CIRCUIT AND IMAGE FORMING APPARATUS USING THE SAME

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/386,476

(22) PCT Filed: Jul. 14, 2010

(86) PCT No.: PCT/JP2010/062284
§ 371 (c)(1),
(2), (4) Date: Jan. 23, 2012

(87) PCT Pub. No.: WO2011/021468
PCT Pub. Date: Feb. 24, 2011

(65) Prior Publication Data
US 2012/0134379 A1    May 31, 2012

(30) Foreign Application Priority Data
Aug. 21, 2009 (JP) .................................. 2009-192349

(51) Int. Cl.
*H01S 3/13* (2006.01)
(52) U.S. Cl.
USPC .............. 372/29.01; 372/29.011; 372/29.014; 372/29.02; 372/38.02; 372/50.12
(58) Field of Classification Search
USPC ................. 372/29.01, 29.011, 29.014, 29.02, 372/38.02
See application file for complete search history.

(56) References Cited

U.S. PATENT DOCUMENTS

| | | | |
|---|---|---|---|
| 7,573,922 B2 | 8/2009 | Kamatani et al. | |
| 7,693,196 B2 | 4/2010 | Kamatani et al. | |
| 2001/0052925 A1* | 12/2001 | Ikeda | ............................ 347/235 |
| 2007/0053395 A1 | 3/2007 | Kamatani et al. | |
| 2008/0278098 A1 | 11/2008 | Kamatani | |
| 2009/0141762 A1 | 6/2009 | Kamatani | |
| 2010/0231988 A1 | 9/2010 | Kamatani | |
| 2010/0278202 A1 | 11/2010 | Kamatani | |
| 2011/0051764 A1 | 3/2011 | Kamatani | |
| 2011/0057703 A1 | 3/2011 | Kamatani | |
| 2011/0228802 A1 | 9/2011 | Furuse et al. | |

FOREIGN PATENT DOCUMENTS

| | | |
|---|---|---|
| JP | 10-81033 | 3/1998 |
| JP | 10-321934 | 12/1998 |
| JP | 2001-24273 | 1/2001 |

(Continued)

OTHER PUBLICATIONS

International Search Report and Written Opinion in PCT/JP2010/062284.

*Primary Examiner* — Dung Nguyen
(74) *Attorney, Agent, or Firm* — Cooper & Dunham LLP

(57) ABSTRACT

A disclosed multi-beam laser power control circuit includes a light receiving element receiving power output from semiconductor lasers to control output power of a semiconductor laser array having plural semiconductor lasers, automatic power control circuits (APC circuits) controlling emission power output from semiconductor lasers based on received corresponding automatic power control execution signals so as to be set to predetermined emission power based on output from the light receiving element, and APC execution signal input terminals inputting the corresponding automatic power control execution signals, wherein, when plural APC execution signals input to the corresponding APC execution signal input terminals are overlapped, the automatic power control circuits (APC circuits) to be preferentially operated is determined based on input timings of the APC execution signals and operated.

5 Claims, 8 Drawing Sheets

(56) References Cited

FOREIGN PATENT DOCUMENTS

| | | |
|---|---|---|
| JP | 2001-257418 | 9/2001 |
| JP | 2002-2015 | 1/2002 |
| JP | 2002-86793 | 3/2002 |
| JP | 2005-153283 | 6/2005 |
| JP | 2006-35703 | 2/2006 |
| JP | 2006-321234 | 11/2006 |
| JP | 2007-73543 | 3/2007 |
| JP | 2007-210238 | 8/2007 |
| JP | 2008-227005 | 9/2008 |
| JP | 2009-135281 | 6/2009 |
| JP | 2009-164193 | 7/2009 |
| JP | 2010-123715 | 6/2010 |
| JP | 2010-157572 | 7/2010 |
| JP | 2010-157573 | 7/2010 |
| JP | 2010-213246 | 9/2010 |
| JP | 2011-54765 | 3/2011 |
| JP | 2011-61024 | 3/2011 |
| JP | 2011-198877 | 10/2011 |

* cited by examiner

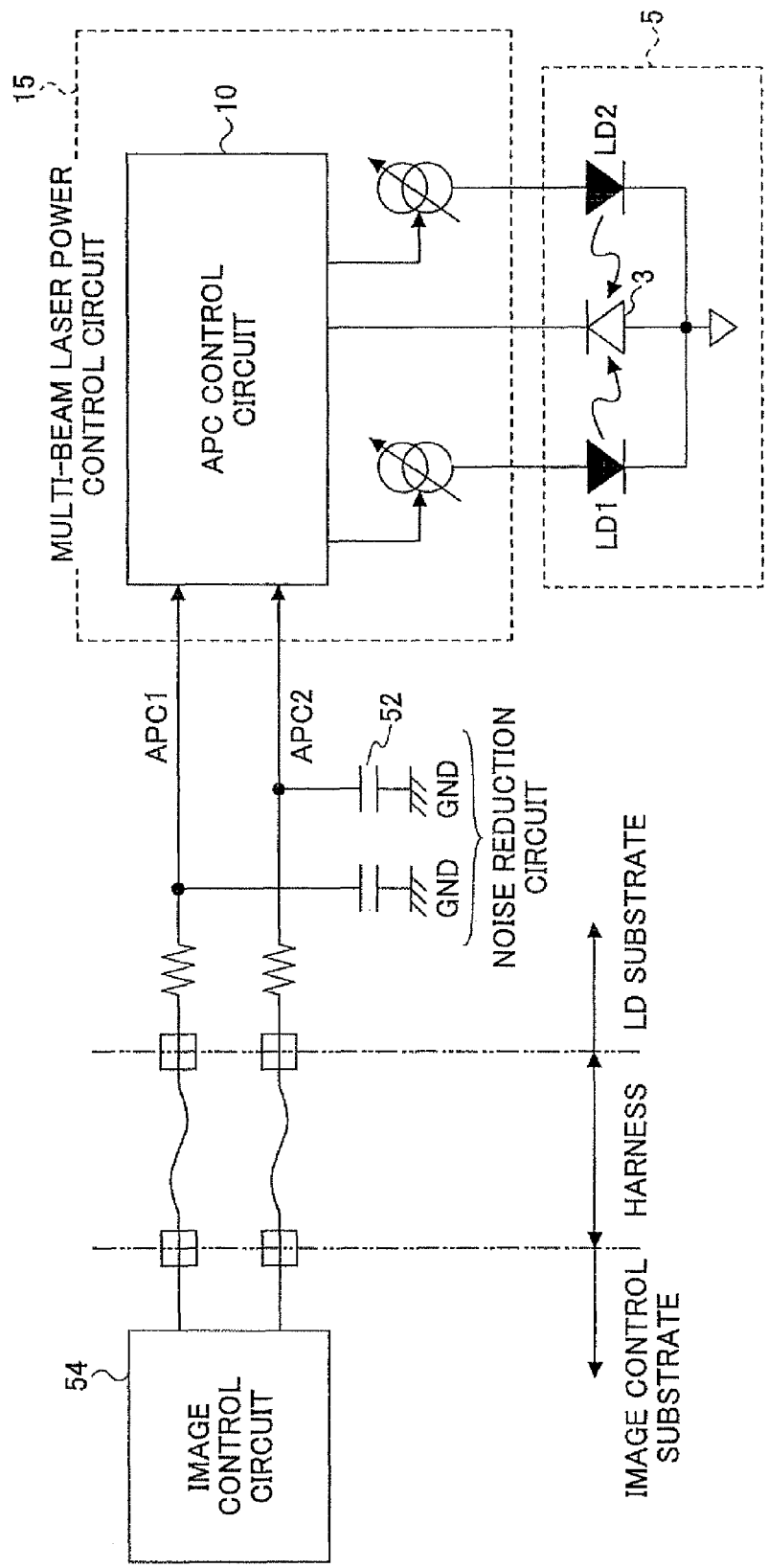

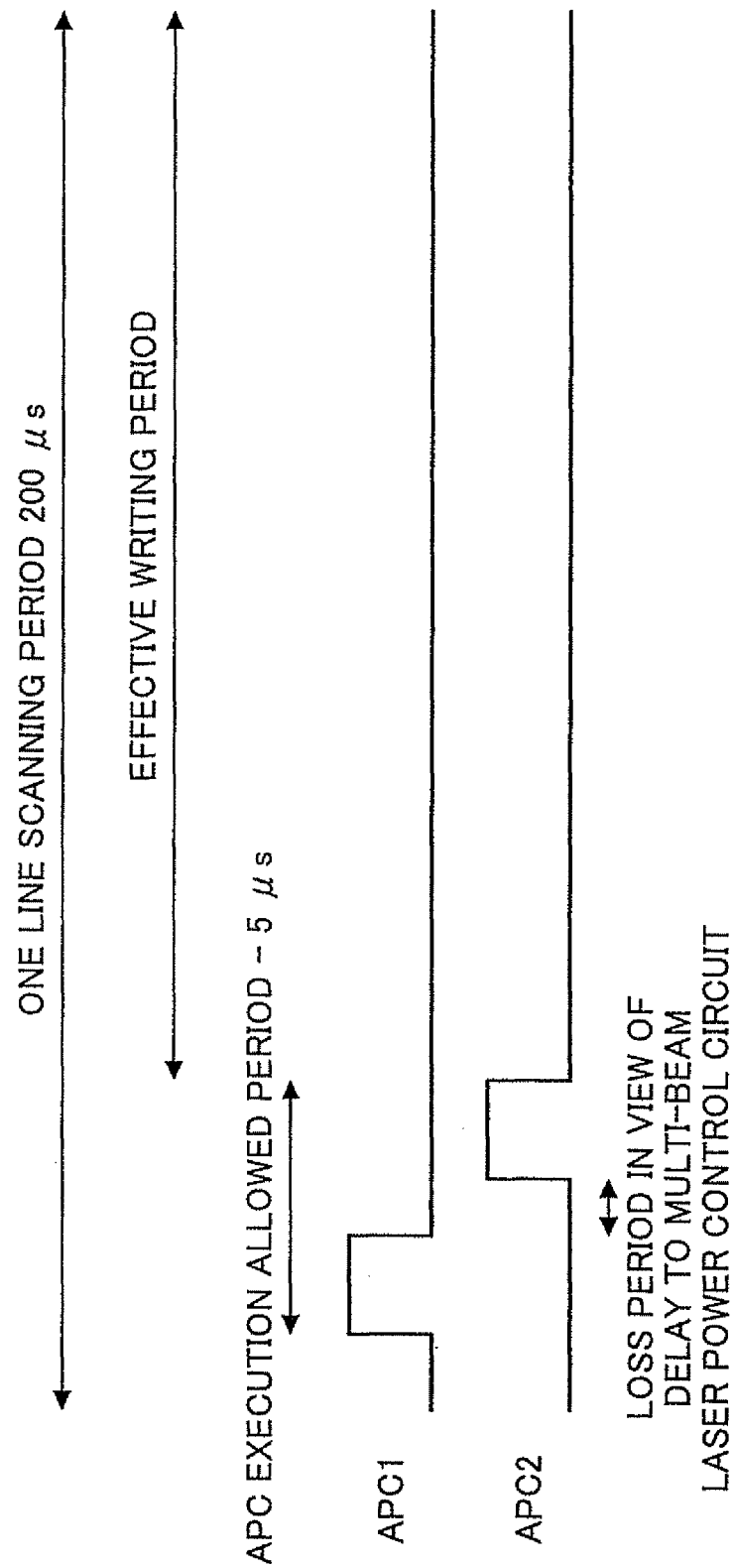

MULTI-BEAM LASER POWER CONTROL CIRCUIT AND IMAGE FORMING APPARATUS USING THE SAME

TECHNICAL FIELD

The present invention relates to a multi-beam laser power control circuit used in an image forming apparatus, and more particularly to a multi-beam laser power control circuit detecting the output power of plural semiconductor lasers using a photodiode and controlling the output power as desired.

BACKGROUND ART

Semiconductor lasers have been widely used in printers, optical disks, optical communications and the like because of their compact size, lower cost, and easiness of obtaining a laser light simply by passing a current. However, the current-output power (optical amount) characteristic of the semiconductor lasers varies depending on the environmental temperature. Because of this feature, it is required to perform a special output power control to obtain a fixed (constant) optical output power. The power (optical output power) control is called Automatic Power Control (APC).

In the Automatic Power Control (APC), before a semiconductor laser is practically used, the semiconductor laser is operated so that the output power of the semiconductor laser is received by using a photodiode (FD). Then, a current value when the output of the photodiode (FD) reaches a predetermined level is stored in a storage means. By using the current value, the output power is controlled to obtain a stable output power. With the recent increase of writing speed in printers and the like, a method has become popular in which plural semiconductor lasers disposed in an array shape are simultaneously driven. In such a semiconductor laser array, the photodiode(s) to be used for the Automatic Power Control (APC) is integrated without fail. However, the number of the photodiodes may be smaller than that of the semiconductor lasers; and in some cases, only one photodiode is integrated.

When the number of the photodiode (FD) is only one, it is required to separately drive the semiconductors one by one. FIG. 7 is a block diagram showing a prior-art relationship among a multi-beam laser power control circuit 15, a semiconductor laser array (multi-beam unit) 5, and an image control circuit 54. As shown in FIG. 7, the semiconductor laser array (multi-beam unit) 5 includes two semiconductor lasers (LD1, LD2) and only one photodiode 3 corresponding to each of the semiconductor lasers (LD1, LD2).

In the semiconductor laser array (multi-beam unit) 5 of FIG. 7, if the Automatic Power Control (APC) is simultaneously performed on those two semiconductor lasers (LD1, LD2), the photodiode 3 regards the total output power from the two semiconductor lasers (LD1, LD2) as the basic output power of each of the two semiconductor lasers (LD1, LD2). Namely, in this case, the APC may be terminated before the power output from the two semiconductor lasers (LD1, LD2) becomes sufficient.

To address such an inconvenience, conventionally, for example, there is a known timing chart in which a time margin is inserted between plural timings at which corresponding APC execution signals (APC1, APC2) are input into the multi-beam laser power control circuit 15, the time margin being determined so as to prevent the APC execution signals (APC1, APC2) from being overlapped with each other when the APC execution signals (APC1, APC2) are input into the multi-beam laser power control circuit 15 in view of parasitic resistance/capacitance due to substrate wirings and the like, the APC execution signals (APC1, APC2) corresponding to two semiconductor lasers and being output from the image control circuit 54 that is provided in a preceding stage of the multi-beam laser power control circuit 15 and that controls the multi-beam laser power control circuit 15 (see, for example, a timing chart of FIG. 8 of Patent Document 1, a timing chart of FIG. 9 of Patent Document 2, and a timing chart of FIG. 8 of Patent Document 3).

SUMMARY OF THE INVENTION

Problem to be Solved by the Invention

As shown in FIG. 7, generally, the multi-beam laser power control circuit 15 and the image control circuit 54 provided in the preceding stage of the multi-beam laser power control circuit 15 are disposed in different substrates. In this configuration, in order to reduce the influence of external noises, a LPF (Low Pass Filter) circuit 52 or the like may be inserted in a preceding stage of the multi-beam laser power control circuit 15 to avoid the malfunction of the Automatic Power Control (APC) due to surrounding external noises. Namely, in a case where the Automatic Power Control (APC) is sequentially performed on plural channels, an extra delay component due to the LPF (Low Pass Filter) circuit 52 may be added to the APC execution signals. Further, the delay component may vary depending on the LPF (Low Pass Filter) circuit 52. Therefore, it is required to determine the time margin between the APC execution signals (channels) in view of the variance of the delay component.

On the other hand, the time period in which the Automatic Power Control (APC) can be performed is limited. For example, as shown in FIG. 8, in a laser printer capable of performing high-speed printing or the like, a scanning time for writing one line may be equal to or less than 200 µs, and only approximately 5 µs may be allowed to be used for performing the Automatic Power Control (APC).

The longer the time period to perform the Automatic Power Control (APC) becomes, the more accurately the output power of the semiconductor laser can be controlled. From this point of view, the longer the time period to perform the Automatic Power Control (APC) becomes, the better. Typically, the time period is equal to or more than 2 ps. Under the condition that the Automatic Power Control (APC) for plural channels is required to be performed within the limited time period allowed for the Automatic Power Control (APC), the time margin between the APC execution signals (channels) to be properly set becomes a practical loss in the time period of the Automatic Power Control (APC) and is a disadvantageous factor in adjusting the output power of the semiconductor lasers.

The present invention is made in light of the above circumstances, and may provide a multi-beam laser power control circuit capable of controlling to perform accurate Automatic Power Control (APC) for a long period as long as possible even when the number of semiconductor lasers is increased without necessarily performing the Automatic Power Control (APC) of the image control circuit in view of the influences of the substrate configuration and the low pass filter (Noise reduction circuit), and an image forming apparatus using the multi-beam laser power control circuit.

Means for Solving the Problems

According to an aspect of the present invention, a multi-beam laser power control circuit includes a light receiving element receiving power output from semiconductor lasers to control output power of a semiconductor laser array having plural semiconductor lasers, automatic power control circuits (APC circuits) receiving corresponding automatic power control execution signals (APC execution signals) and controlling emission power output from semiconductor lasers based on the received corresponding automatic power control execution signals (APC execution signals) so that the emission power output from the respective semiconductor lasers are set to predetermined emission power based on output from the light receiving element, and APC execution signal input terminals inputting the corresponding automatic power control execution signals, a number of the input automatic power control execution signals corresponding to a number of the automatic power control circuits (APC circuits). Further, in the multi-beam laser power control circuit, when plural APC execution signals input to the corresponding APC execution signal input terminals are overlapped in time domain, the automatic power control circuits (APC circuits) to be preferentially operated is determined based on input timings of the plural APC execution signals and operated.

Further, in the multi-beam laser power control circuit according to an aspect of the present invention, at the input timings of the APC execution signals, the automatic power control circuit (APC circuit) corresponding to the APC execution signal that is input earlier may be preferentially operated; otherwise, at the input timings of the APC execution signals, the automatic power control circuit (APC circuit) corresponding to the APC execution signal that is input later may be preferentially operated.

Further, the multi-beam laser power control circuit according to an aspect of the present invention may include a reporting unit externally reporting information indicating that, when the received plural APC execution signals are overlapped in time domain, the received plural APC execution signals are overlapped.

Further, in the multi-beam laser power control circuit according to an aspect of the present invention, when plural APC execution signals are simultaneously received, the automatic power control circuits (APC circuits) may be preferentially operated based on a predetermined priority order.

According to an aspect of the present invention, there is provided an image forming apparatus including any one of the above-described multi-beam laser power control circuits.

Effect of the Invention

According to an embodiment of the present invention, it may become possible to transmit the APC execution signals to the multi-beam laser power control circuit without necessarily performing a complicated timing control including, for example, controlling the delay due to surrounding external noises in the image control circuit disposed in the preceding stage of the multi-beam laser power control circuit. For example, even when two or more APC execution signals each indicating APC execution status are transmitted from the image control circuit disposed in the preceding stage, it may become possible for the multi-beam laser power control circuit to perform the Automatic Power Control (APC) by determining the priority order of the APC execution signals without causing overlaps among the APC execution signals. Further, when plural Automatic Power Controls (APC) are performed within a short time period, the plural Automatic Power Controls (APC) may be performed sequentially without necessarily setting the time margin between the APC execution signals (channels). Because of this feature, it may become possible to perform more accurate Automatic Power Control (APC).

Further, it may become possible to reduce the time period required for performing the Automatic Power Control (APC), thereby enabling realizing a high-speed image forming apparatus.

Patent Document 1: Japanese Patent Application Publication No. 2006-035703

Patent Document 2: Japanese Patent Application Publication No. 2005-153283

Patent Document 3: Japanese Patent Application Publication No. 2001-257418

BRIEF DESCRIPTION OF THE DRAWINGS

FIG. 7 is a block diagram showing a prior-art relationship among the multi-beam laser power control circuit, a semiconductor laser array (a multi-beam unit), and an image control circuit; and FIG. 8 is a schematic drawing showing a relationship among a one-line scanning period, an APC execution allowed period, an effective writing period, and a loss period in view of a delay to the multi-beam laser power control circuit.

DESCRIPTION OF THE REFERENCE NUMERALS

LD1, LD2: SEMICONDUCTOR LASER
3: PHOTODIODE
5: SEMICONDUCTOR LASER ARRAY (MULTI-BEAM UNIT)
6: APC SIGNAL SELECTION CIRCUIT
10, 11, 12: APC CONTROL CIRCUIT
15, 16: MULTI-BEAM LASER POWER CONTROL CIRCUIT
24: RS LATCH CIRCUIT
26: DELAY CIRCUIT
54: IMAGE CONTROL CIRCUIT

MODE FOR CARRYING OUT THE INVENTION

In the following, preferred embodiments of the present invention are described with reference to the accompanying drawings.

First Embodiment

Figure 1:
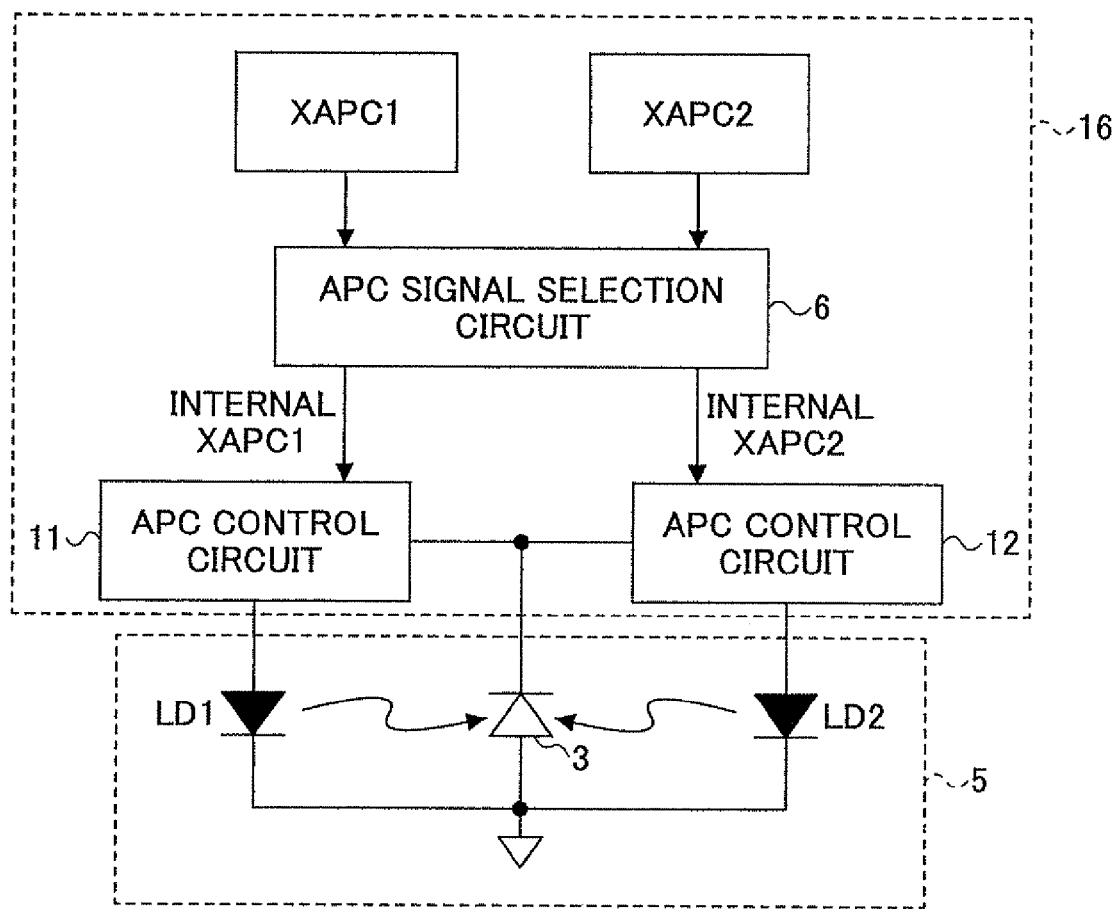
FIG. 1 is a schematic block diagram showing a multi-beam laser power control circuit according to a first embodiment of the present invention.

FIG. 1 is a schematic block diagram of a multi-beam laser power control circuit 16 according to a first embodiment of the present invention. In FIG. 1, in addition to the block diagram of the multi-beam laser power control circuit 16, a block diagram of a semiconductor laser array (multi-beam unit) 5 is included.

As shown in FIG. 1, the semiconductor laser array (multi-beam unit) 5 includes two semiconductor lasers (LD1, LD2) and one photodiode 3 corresponding to those two semiconductor lasers (LD1, LD2). Further, the multi-beam laser power control circuit 16 of FIG. 1 includes an APC signal selection circuit 6, an APC control circuit 11 for LD1, and an APC control circuit 12 for LD2, and APC execution signal input terminals to externally input the APC execution signals. The APC execution signals are input to the respective APC execution signal input terminals, the number of the APC execution signals corresponding to that of the APC control circuits 11 and 12.

Further, in FIG 1, the symbols "XAPC1" and "XAPC2" refer to the APC execution signals from an external circuit (such as an image control circuit) ("external APC execution signal(s)"). As described above, in this description, it is assumed that when the APC execution signal is "Low", the APC is to be executed ("APC execution logic"). The APC signal selection circuit 6 receives the "XAPC1" and "XAPC2". Then, in a period when the both received "XAPC1" and "XAPC2" are "Low" (i.e., in the APC execution logic), at the timing when both of the "XAPC1" and "XAPC2" are input (i.e., become "low") (input timing of both of the "XAPC1" and "XAPC2"), the APC signal selection circuit 6 selects one of the received signals in a manner such that the APC signal selection circuit 6 sets the selected one to be "Low" and the other to be "High" and outputs the results as "Internal-XAPC 1" and "Internal -XAPC2". The symbols "Internal-XAPC 1" and "Internal-XAPC2" refer to the APC execution signals finely adjusted by the APC signal selection circuit 6 based on the "XAPC1" and "XAPC2", respectively and transmitted within the multi-beam laser power control circuit 16 ("internal APC execution signal(s)"). The "Internal-XAPC 1" is input into the APC control circuit 11 to control the APC execution of the semiconductor laser LDI. Similarly, the "Internal-XAPC 2" is input into the 15 APC control circuit 12 so as to control the APC execution of the semiconductor laser LD2.

Figure 2:
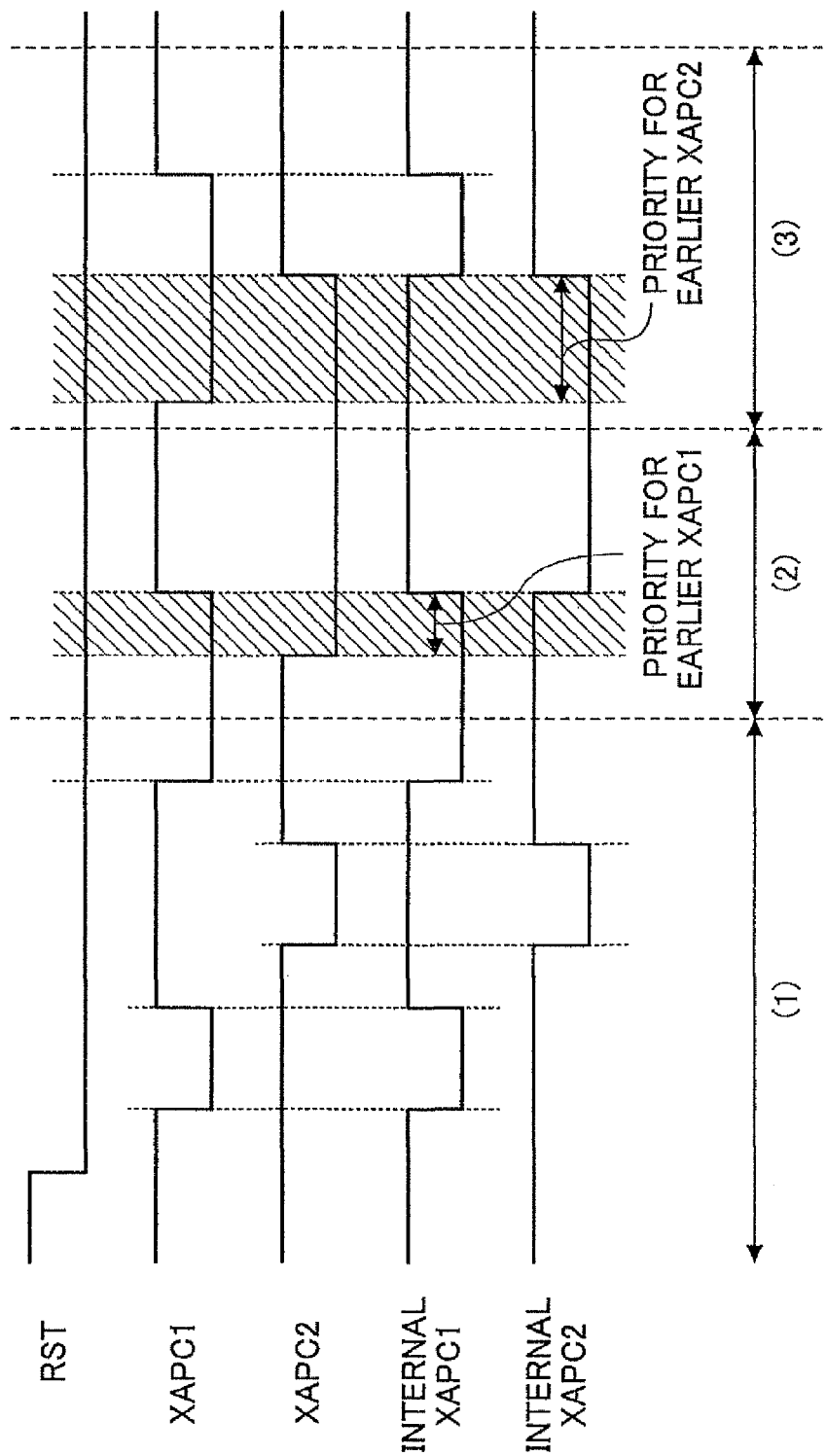
FIG. 2 is an exemplary timing chart corresponding to an example based on a selection logic employed in an APC signal selection circuit according to the first embodiment of the present invention.

As described above, in a period when both of the "XAPC1" and "XAPC2" are "Low", the APC signal selection circuit 6 selects one of the "XAPCI" and "XAPC2" signals, sets the selected signal to "Low", sets the other signal to "High", and outputs the signals as the "Internal-XAPC 1" and the "Internal-XAPC2". In this case, for example, at the input timing of both of the APC execution signals (the "XAPC1" and "XAPC2"), the APC signal selection circuit 6 may employ a selection logic that a higher priority is given to the operation of the APC control circuit corresponding to the APC execution signal that is input earlier (i.e., the APC signal selection circuit 6 sets only the internal APC execution signal to "Low", the internal APC execution signal corresponding to the external APC execution signal that is input earlier). FIG. 2 is an example of timing chart corresponding to this selection logic.

FIG. 2 is an exemplary timing chart of a multi-beam laser power control circuit dedicated to a two-channel LD-A. In this timing chart, a symbol "RST" refers to a reset signal of the multi-beam laser power control circuit 16, and the reset status is released when the reset signal is "Low". The symbols "XAPC1" and "XAPC2" refer to the external APC execution signals, and the APC is to be executed (APC execution logic) when the corresponding external APC execution signal is "Low". Namely, the status that the "XAPC1" and "XAPC2" are "Low" indicates that each execution of the APC of the respective LD1 and LD2 is externally instructed. The symbols "Internal-XAPC1" and "Internal-XAPC2" refers to the internal APC execution signals. The status that the internal APC execution signal is "Low" indicates that the corresponding APC is executed (APC execution logic). Namely, when the "Internal-XAPC1" and "Internal-XAPC2" are "Low", the APC of the respective LD1 and LD2 is actually executed.

Referring back to FIG. 2, after the RST is released, in the period of (1), the "XAPC1" and the "XAPC2" have their own "Low" periods; and accordingly, the APC for the corresponding semiconductor lasers (LD1, LD2) is separately executed.

Next, in the period of (2), there is a period when both of "XAPC1" and "XAPC2" are "Low". However, before this period, the "XAPC1" becomes "Low" earlier than the "XAPC2". Therefore, in this period, even when the "XAPC2" becomes "Low", the "Internal-XAPC2" remains "High". After that, the "Internal-XAPC2 " becomes effective ("Low") only when "XAPC2" remains "Low" and the XAPC1" is "High".

In the period of (3), in contrast to the period of period (2), while the "XAPC2" remains "Low", the "XAPC1" becomes "Low". In this case also, "Internal-XAPC1" does not become effective ("Low") until "XAPC2" becomes "High".

In the period of (3), in contrast to the period of period (2), while the "XAPC2" remains "Low", the "XAPC1" becomes "Low". In this case also, "Inter-XAPC1" does not become effective ("Low") until "XAPC2" becomes "High".

Figure 3:
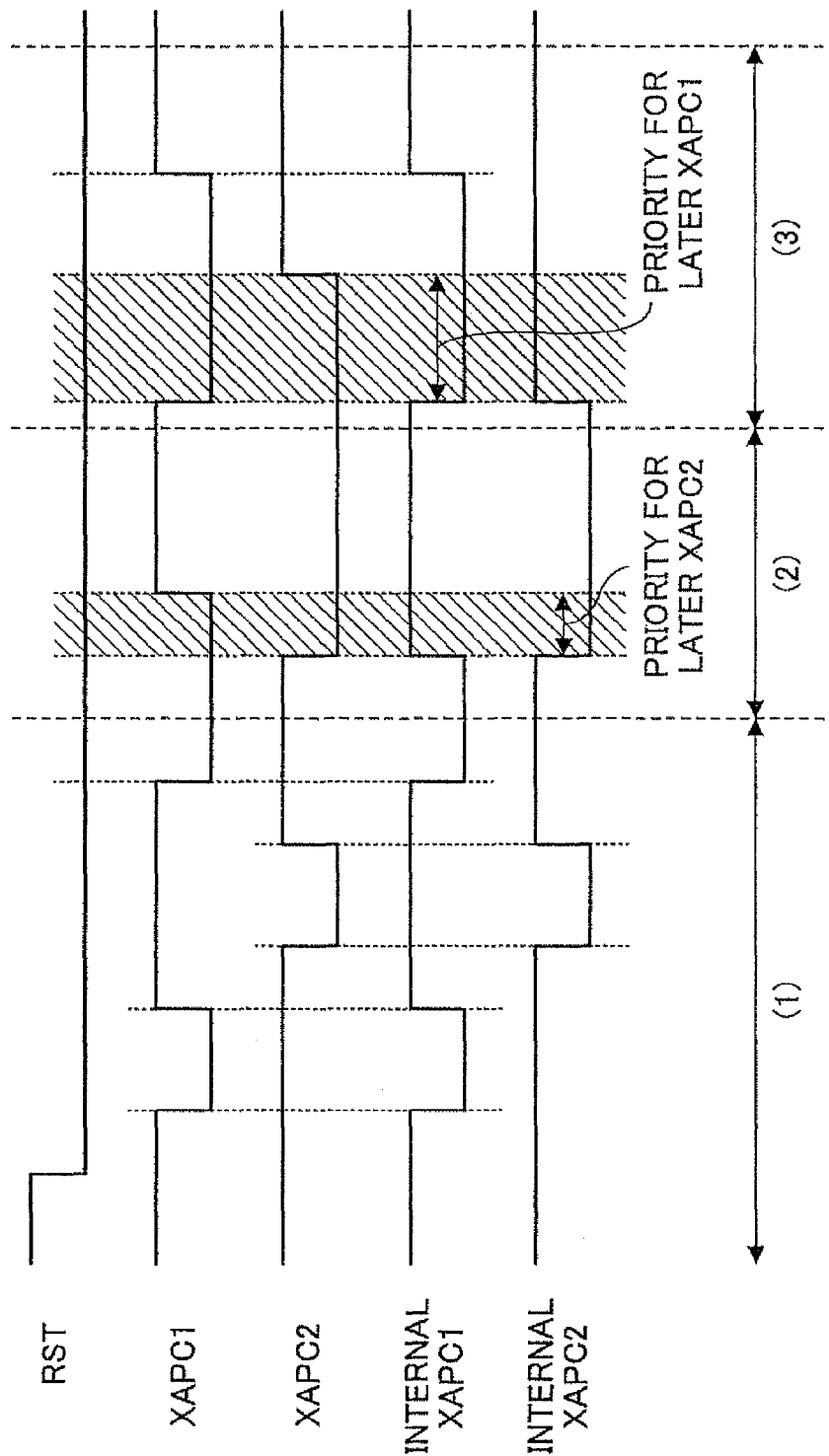
FIG. 3 is an exemplary timing chart corresponding to an example based on another selection logic employed in the APC signal selection circuit according to the first embodiment of the present invention.

As described above, FIG. 2 shows an example of a timing chart showing a case where, at the input timings of the external APC execution signals, the APC signal selection circuit 6 employs the selection logic that a higher priority is given to the operation of the APC control circuit corresponding to the external APC execution signal that is input earlier. However, in contrast, the signal selection circuit 6 may employ another selection logic that a higher priority is given to the operation of the APC control circuit corresponding to the external APC execution signal that is input later. FIG. 3 shows an example of the timing chart corresponding to the selection logic.

Figure 4:
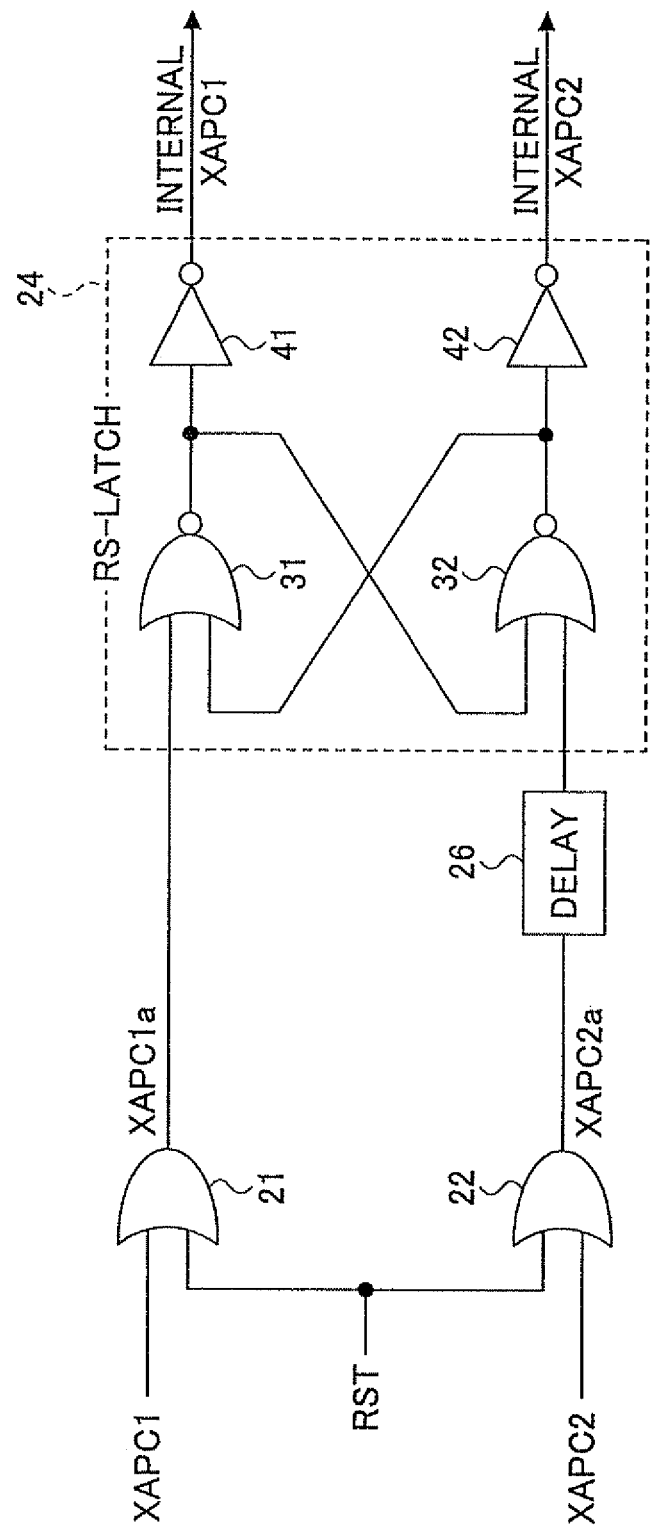
FIG. 4 is an example of a circuit diagram of the APC signal selection circuit according to the first embodiment of the present invention.

Next, FIG. 4 shows an exemplary APC signal selection circuit 6 based on the selection logic that "a higher priority is given to the operation of the APC control circuit corresponding to the external APC execution signal that is input earlier", the selection logic being illustrated in the timing chart of FIG. 2. In the APC signal selection circuit 6, the logic sum (OR) between the "XAPC1" or the "XAPC2" and the "RST" is given as the "XAPC1$a$" or the "XAPC2$a$", respectively. A NOR-type RS latch circuit 24 selects only one of the "XAPC1$a$" and the "XAPC2$a$" which is input earlier as effective. Based on a result of this selection, the NOR-type RS latch circuit 24 outputs the "Internal-XAPC1" and the "Internal-XAPC2". As described above, the "Internal-XAPC1" and the "Internal-XAPC2" are the APC execution signals within the multi-beam laser power control circuit 16 (internal APC execution signals).

In the prior art, the "XAPC1" and "XAPC2" are directly used as the "Internal-XAPC1" and "Internal-XAPC2". However, by adding the small-scale circuit according to an embodiment of the present invention as shown in FIG. 4, it may become possible to avoid the occurrence of a power control error due to simultaneous APC execution between plural channels.

Further, as shown in FIG. 4, the APC signal selection circuit 6 may include a delay circuit 26 that delays the corresponding APC execution signal when, for example, the APC execution signals are simultaneously input in plural channels. By having the delay circuit 26 in FIG. 4, the "XAPC2a" signal within the APC signal selection circuit 6 is delayed, so that a higher priority is given to the "XAPC1a" signal and as a result, only the "Internal-XAPC1" becomes low. Namely, a higher priority is given to the APC execution of the LD1.

As described above, by inserting the delay circuit 26 as described in FIG. 4, it may become possible to determine which semiconductor laser has a higher priority to execute the APC when plural APC execution signals are simultaneously input. Embodiment generating a signal indicating an overlap of APC execution signals First, FIG. 5 is a timing chart including a timing of a signal externally reporting an overlap of the APC execution signals when the APC execution signals of plural channels are overlapped in time domain (external report signal).

Figure 5:
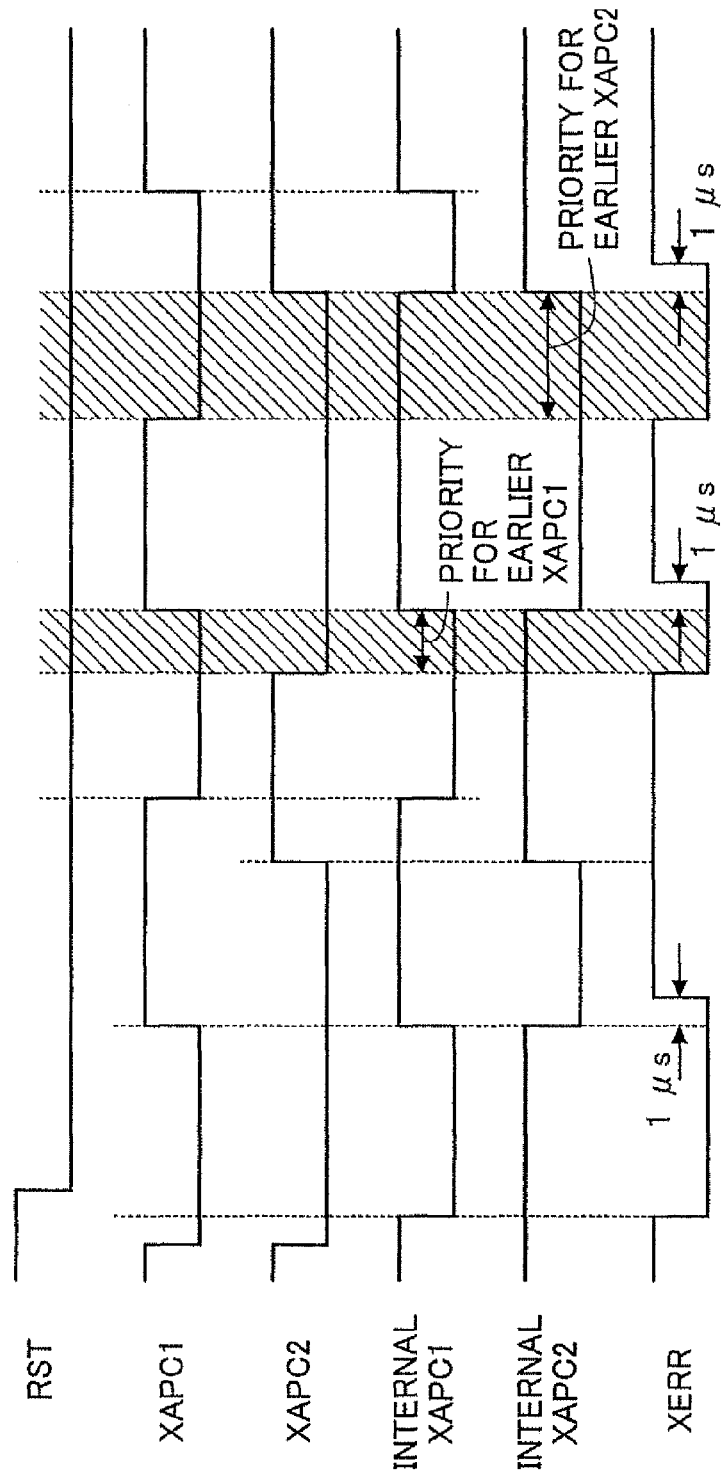
FIG. 5 is an exemplary timing chart including a signal for externally reporting information indicating that the APC execution signals are overlapped with each other.

In the timing chart of FIG. 5, the "XERR" signal corresponds to the external report signal. The "Low" status of the "XERR" signal indicates that the APC execution signals are overlapped. In this case, if the "XERR" signal reports only the period during the APC execution signals are exactly overlapped, since the period during the APC execution signals are overlapped is a very short period such as several ns (nanoseconds), the period may not be correctly detected by an external receiving device (e.g., control circuit). To overcome this inconvenience, as shown in the timing chart of FIG. 5, the APC signal selection circuit 6 adds several μs (microseconds) (one μs in FIG. 5) to the period during the APC execution signals are overlapped to elongate the report signal.

Figure 6:
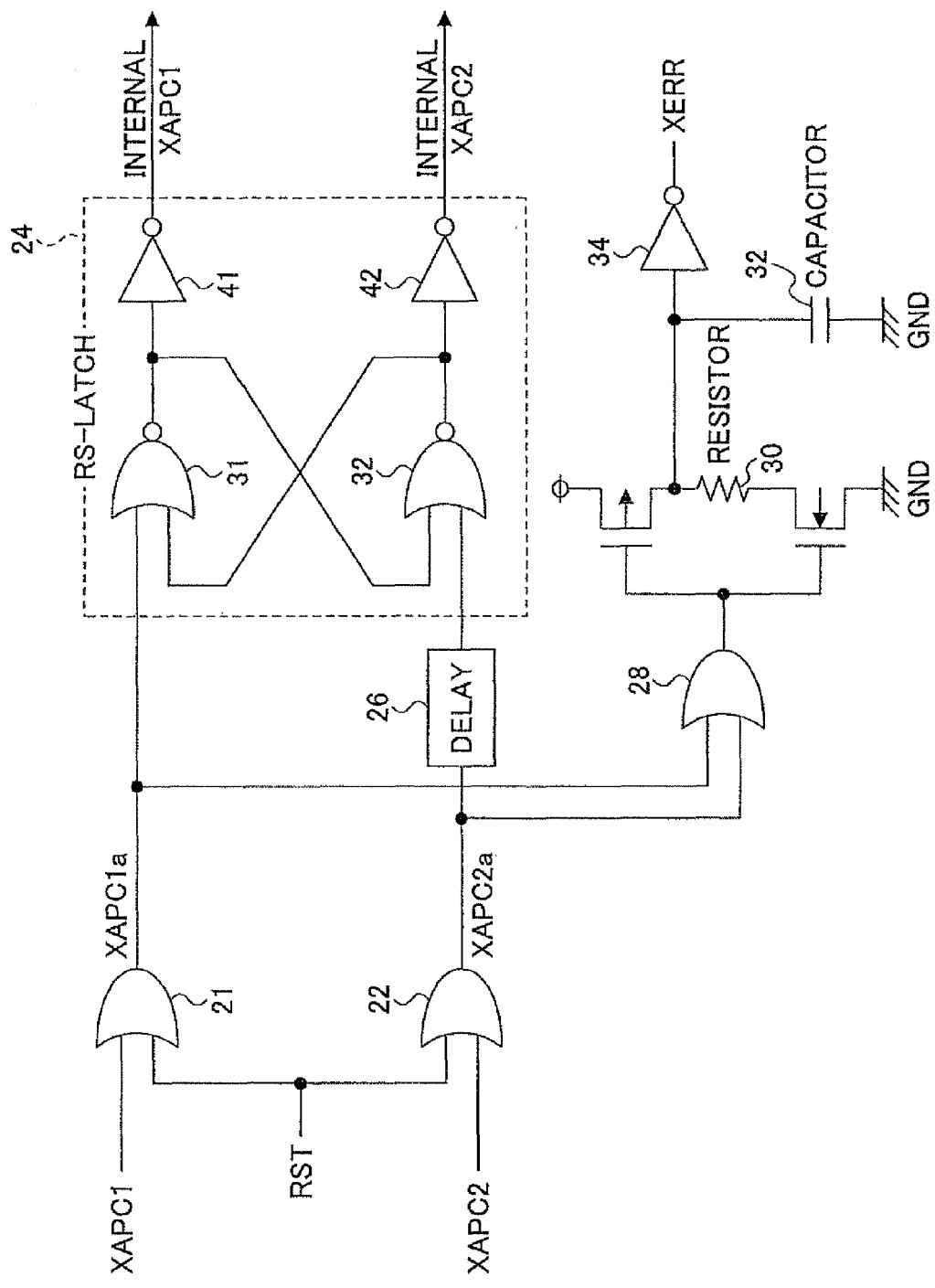
FIG. 6 is another example of a circuit diagram of the APC signal selection circuit according to the first embodiment of the present invention.

FIG. 6 shows an exemplary APC signal selection circuit 6 generating the elongated report signal. The circuit of FIG. 6 is basically similar to that of FIG. 4 except that the circuit of FIG. 6 includes an OR circuit 28 and a Delay section, the OR circuit 28 receiving the "XAPC1a" and the "XAPC2a" signals.

The Delay section includes an inverter circuit 34 having an input connected to a resistor 30 and a capacitor 32. As soon as both the "XAPC1a" and the "XAPC2a" are "Low", the "XERR" signal is "Low". However, even when at least one of the "XAPC1a" and the "XAPC2a" is returned to "High", due to a time constant formed by the resistance of the resistor 30 and the capacitance of the capacitor 32, a delay is generated between a period from "Low" to "High" of the "XERR" signal. By doing in this way, the period of the report signal may be elongated.

Other Embodiment

In the above description, a configuration of the multi-beam laser power control circuit dedicated to a two-channel LD-A is described. However, the present invention may also be applied to a multi-beam laser power control circuit for an LD-A having three or more channels, and the present invention may be realized in a circuit for three or more channels in a similar manner to that for the two-channel LD-A as described above.

Further, by using the above-described multi-beam laser power control circuit in an image forming apparatus, it may become possible to realize a high-speed image forming apparatus capable of reducing the exact time period allowed for the APC execution.

The present application is based on and claims the benefit of priority of Japanese Patent Application No. 2009-192349 filed on Aug. 21, 2009, the entire contents of which are hereby incorporated herein by reference.

The invention claimed is

1. A multi-beam laser power control circuit comprising:
a light receiving element configured to receive power output from semiconductor lasers to control output power of a semiconductor laser array having plural semiconductor lasers;
automatic power control circuits (APC circuits) configured to receive corresponding automatic power control execution signals (APC execution signals) and control emission power output from semiconductor lasers based on the received corresponding automatic power control execution signals (APC execution signals) so that the emission power output from the respective semiconductor lasers are set to predetermined emission power based on output from the light receiving element;
APC execution signal input terminals configured to input the corresponding automatic power control execution signals, a number of the input automatic power control execution signals corresponding to a number of the automatic power control circuits (APC circuits), wherein when plural APC execution signals input to the corresponding APC execution signal input terminals are overlapped in time domain, the automatic power control circuits (APC circuits) to be preferentially operated is determined based on input timings of the plural APC execution signals and operated; and
a reporting unit configured to externally report information indicating that, when the received plural APC execution signals are overlapped in time domain, the received plural APC execution signals are overlapped.

2. The multi-beam laser power control circuit according to claim 1, wherein
at the input timings of the APC execution signals, the automatic power control circuit (APC circuit) corresponding to the APC execution signal that s input earlier is preferentially operated.

3. The multi-beam laser power control circuit according to claim 1, wherein
at the input timings of the APC execution signals, the automatic power control circuit (APC circuit) corresponding to the APC execution signal that is input later is preferentially operated.

4. The multi-beam laser power control circuit according to claim 1, wherein
when plural APC execution signals are simultaneously received, the automatic power control circuits (APC circuits) are preferentially operated based on a predetermined priority order.

5. An image forming apparatus comprising:
a multi-beam laser power control circuit according to claim 1.

* * * * *